United States Patent [19]

Tsuji et al.

[11] Patent Number: 4,565,998
[45] Date of Patent: Jan. 21, 1986

[54] DIODE FAILURE DETECTING DEVICE IN ROTARY RECTIFIER

[75] Inventors: Nobuhiko Tsuji; Keijiro Nakamura; Masanori Iike, all of Kanagawa, Japan

[73] Assignee: Fuji Electric Company Limited, Kanagawa, Japan

[21] Appl. No.: 466,753

[22] Filed: Feb. 15, 1983

[30] Foreign Application Priority Data

Feb. 15, 1982 [JP] Japan ................. 57-21319

[51] Int. Cl.$^4$ ............................. G08B 21/00
[52] U.S. Cl. ................... 340/645; 310/68 R; 340/639; 340/815.31; 363/53
[58] Field of Search ........... 340/638, 645, 639, 815.31; 361/31; 363/52, 53; 310/68 D, 68 R

[56] References Cited

U.S. PATENT DOCUMENTS 3,532,873 10/1970 Batson et al. ............ 340/815.31
3,538,312 11/1970 Genähr ................... 340/815.31

FOREIGN PATENT DOCUMENTS 3205475 6/1982 Fed. Rep. of Germany ...... 340/638
98903 4/1979 Japan .......................... 340/638

Primary Examiner—James L. Rowland
Assistant Examiner—Daniel Myer
Attorney, Agent, or Firm—Sughrue, Mion, Zinn, Macpeak & Seas

[57] ABSTRACT

A diode failure detecting device in a rotary rectifier having fuses provided respectively for phases and connected in series to rectifying diodes. Light emitting diode circuits in one embodiment are connected in parallel respectively to the fuses which are arranged on the peripheral surface of a rotor. The LED's preferably emit light in different emission spectra when the respective fuses are blown out. An optical fiber sensor is provided on the side of a stator, for detecting when the LED's emit light and a photo-electric converter converts optical signals applied thereto through the optical fiber sensor into electrical signals through optical spectral discrimination separately according to the phases of the rectifier. A logic circuit determines the flow of over-current in the rectifying diodes from an output of the photo-electric converter. In a second embodiment, flags on the fuses are optically scanned to determine the presence of a blow fuse. By determining the absence of a pulse or determining pulse width, the detection of a flag is made. If the reflectivities of the flags vary, identification of a particular blown fuse can be made.

15 Claims, 18 Drawing Figures

DIODE FAILURE DETECTING DEVICE IN ROTARY RECTIFIER

BACKGROUND OF THE INVENTION

This invention relates to a rectifying diode failure detecting device which is provided on the rotor of a rotary rectifier.

A strobe type failure detecting device as shown in FIG. 1 is conventionally provided for a rotary rectifier used for a brushless AC generator in order to detect diode failures during operation. A rotor 1 is provided with a three-phase bridge circuit comprising diodes 2 and fuses 3 which are series-connected as shown in FIG. 2. Each fuse has an operation displaying unit which, typically as shown in FIG. 1, employs a fusing flag 3A which is raised when the fuse is blown out. The fuses thus constructed are arranged on the periphery of the rotor 1 at equal intervals. Each fusing flag is colored, so that its raising operation is detected as a change in color. With respect to the rotor 1 having fuses 3 and their associated flags, an observing window 4 is cut in the stationary frame of the rotor. Intermittent light from a stroboscope 5 is applied through the observing window 4 to the mounting base of each fuse. A visual operator inspection 6 detects whether or not flag 3A is raised. Hence, detection of the flag 3A provides indicia of whether or not an excessively large current flows in the diode 2.

With the above-described prior art device, failure is detected manually. Accordingly, the failure is detected only when the device is inspected for maintenance. Such a prior art device is disadvantageous in that it is difficult to continuously monitor the device, and accordingly, it is impossible to quickly deal with failure or to protect the device in the occurrence of failure. In the operating environment of a rotary rectifier, electromagnetic effects inhibit reliable operation of a mechanical fuse flag arrangement. Moreover, maintenance costs are relatively high.

SUMMARY OF INVENTION

An object of this invention is to provide a detecting device which overcomes these disadvantages of the prior art. This invention in one embodiment comprises light emitting diode circuits including light emitting diodes which, when the respective fuses are blown out, emit light which may be in different emission spectra, separately, according to the phases. An optical fiber sensor detects when the light emitting diode emits light, and a decision circuit determines whether or not a fuse has been blown out from an electrical signal which is obtained by subjecting an optical signal from the sensor to optical spectral discrimination. Hence, rectifying diode failures can be contactlessly, continuously and automatically detected separately according to the phases of the rectifier.

In accordance with a second preferred embodiment of this invention, a detecting device uses a conventional fuse structure having flags. A reflection type optical fiber sensor having a light applying section irradiates the flags of fuses for phases of the rectifier which are arranged along the peripheral surface of the rotor. A light receiving section receives light reflected from the flags. A decision circuit detects whether or not a pulse train signal obtained by converting an optical signal from the sensor lacks a periodic pulse generated by sensing the passing of an unblown fuse to determine whether or not a fuse has been blown out. The failure of a diode can be contactlessly, continuously and automatically detected.

In a first modification of the second embodiment, a pulse width determination can be made as the criteria to determine whether a fuse has been blown. A signal processing decision circuit uses the same input data but determines pulse width as a function of trailing edge detection.

In a second modification of this embodiment, a number of different scanning paths are provided using a series of light applying lenses and light receiving lenses. This enlarges the scanning area to take into account misaligned fuses or thermal contraction and expansion of the system. The decision circuit receives parallel inputs from each light receiving element and an OR gate produces a single output if any fuse is blown. Signal processing then proceeds in a manner set forth relative to the second embodiment.

This invention will be described in greater detail by referring to the drawing and the description of the preferred embodiments that follow.

DESCRIPTION OF THE PREFERRED EMBODIMENTS

Figure 1:
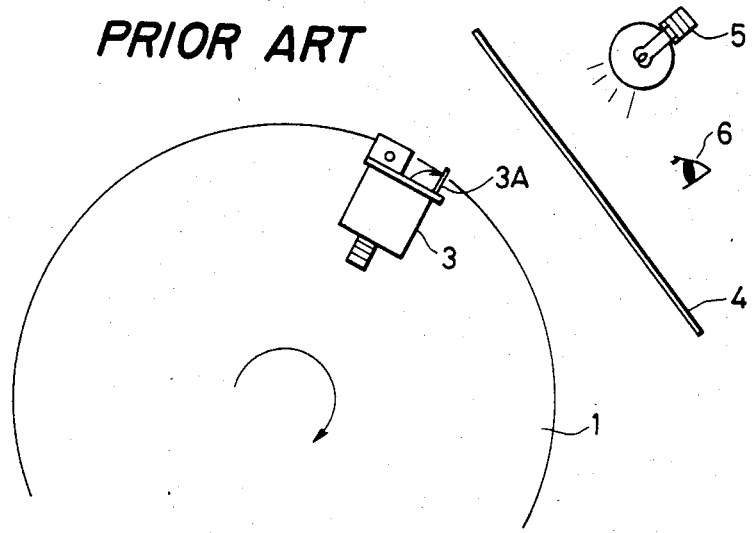
FIG. 1 is an explanatory diagram illustrating a prior art strobe type failure detecting device.
Figure 2:
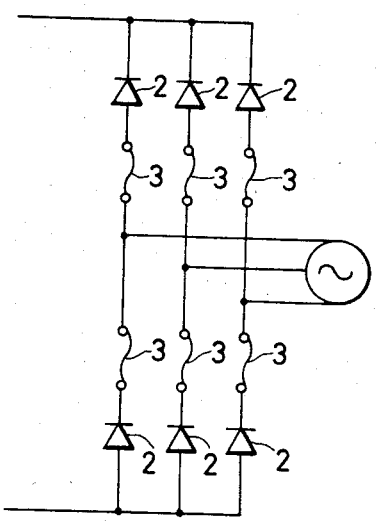
FIG. 2 is a circuit diagram showing a rectifier circuit provided for a rotor of FIG. 1.
Figure 3:
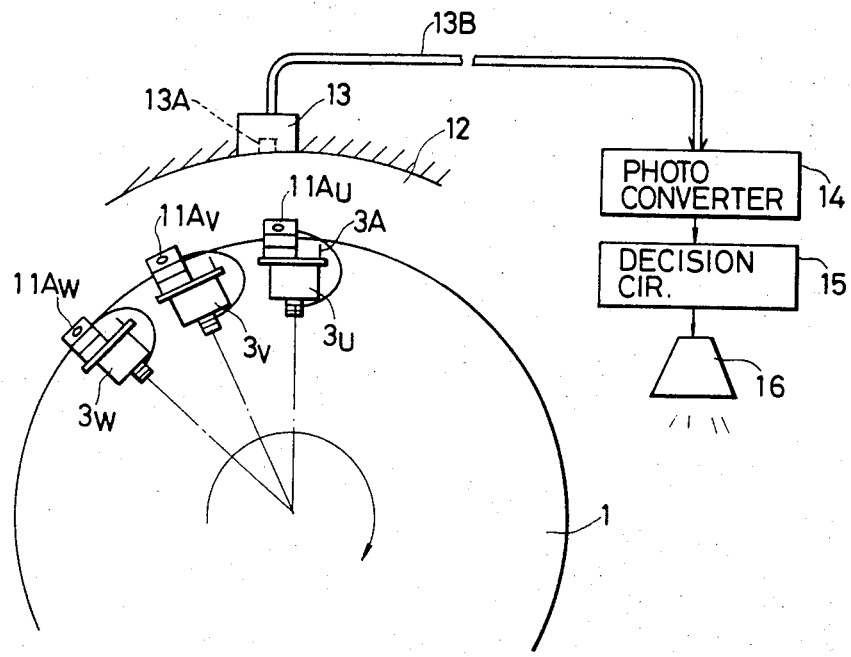
FIG. 3 is an explanatory diagram showing the arrangement of a first embodiment of this invention.
Figure 4:
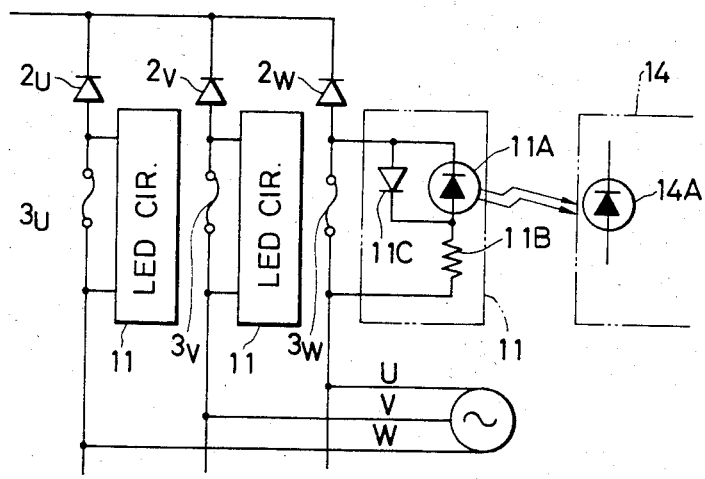
FIG. 4 is a circuit diagram showing a rectifier circuit in the FIG. 3 embodiment.

Referring now to FIG. 3, the arrangement of a first preferred embodiment of this invention is illustrated. As shown in FIG. 3 and FIG. 4, fuses $3_U$, $3_V$, and $3_W$ provided respectively for three phases are connected to diodes $2_U$, $2_V$, and $2_W$, respectively. The fuses are provided on the rotor 1 of a rotary rectifier and have fusing flags 3A. Each of the fuses modified in accordance with this invention so that it is shunted by a light emitting diode circuit 11 which comprises a light emitting diode 11A, a current limiting resistor 11B, and a clamping diode 11C as shown in FIG. 4. The light emitting diodes 11A$_U$, 11A$_V$, and 11A$_W$ of the light emitting diodes circuits 11 of the three phases are arranged along the peripheral surface of the rotor 1 so that light is emitted towards the stator 12. Furthermore, the light emitting diodes are arranged circumferentially on the rotor, so that, when viewed from the stator, they are aligned with the rotor axis.

The stator 12 has an optical fiber sensor head 13. The sensor head 13 has a light receiving lens 13A optically aligned with each of the light emitting diodes 11A$_U$, 11A$_V$, and 11A$_W$ on the rotor 1 to receive light from the light emitting diodes. An optical fiber 13B introduces the light thus received to a photo-electric converter 14.

In this embodiment, displacement in the axial direction of the rotor may be compensated by employing a line structure in which a plurality of light receiving lenses 13A and optical fibers 13B in combination are arranged in the rotor axis direction. Alternatively, a line structure in which a plurality of light emitting diodes 11A$_U$, 11A$_V$ and 11A$_W$ of three phases of the rectifier is arranged in the rotor axis direction. The light receiving lens 13A should preferably have a sufficiently long distance between itself and each light emitting diode, to positively detect light.

With the light emitting diode circuits and the sensor head 13 provided as described above, when a fuse, for example, 3$_U$, is blown out, the supply voltage is applied to the light emitting diode 11A$_U$ through the rectifying diode. Accordingly, current flowing in the resistor 11B causes the light emitting diode 11A$_U$ to emit light. This light is applied through the sensor head 13 to the photo-electric converter 14. One light input is applied per fuse whenever the rotor makes one revolution and is converted into an electrical signal by a light receiving diode 14A in the photo-electric converter 14. Accordingly, the photo-electric converter 14 outputs pulse signals the number of which is equal to the number of blown fuses for each revolution of the rotor. A corresponding emission by another LED will occur if another fuse (3$_V$ or 3$_W$) is blown out. The output of the photoelectric converter 14 is applied to a decision circuit 15 which determines from the presence or absence of the pulse input whether or not a fuse is blown. When the decision circuit 15 determines that a fuse has blown, it provides protective operating signals to drive an alarm 16 and to stop the operation of the generator. The flag 3A indicates which fuse has blown.

Figure 5:
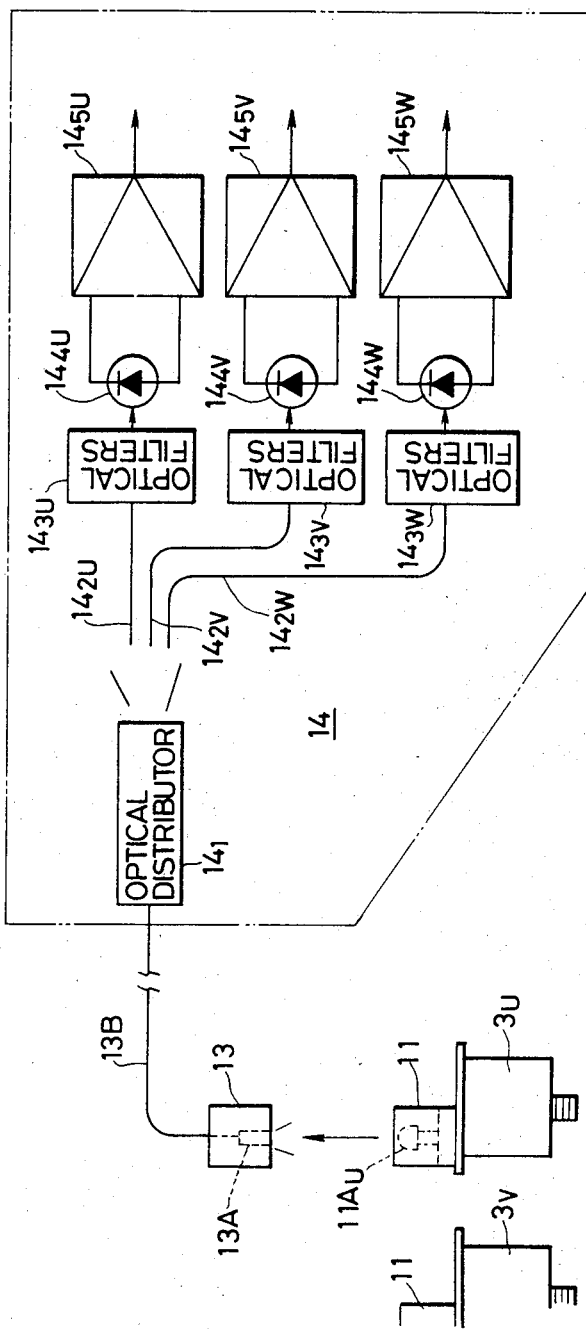
FIG. 5 is an explanatory diagram, partly as a circuit diagram, showing the detailed arrangement of a photoelectric converter in FIG. 3.

The LED's 11A$_U$, 11A$_V$ and 11A$_W$ of the light emitting diode circuits 11, which are connected in parallel to the fuses of three phases respectively, are preferably different in their respective emission spectrum. Thus, optical inputs to the photo-electric converter 14 are different in spectral distribution according to the fuses which are blown out, i.e., according to the phases of the rectifying diodes in which there is over-current. The detailed arrangement of the photo-electric converter 14 is shown in FIG. 5. The optical input section of the converter 14 has an optical fiber distributor 14$_1$ to distribute input light to three-phase optical fibers 14$_{2U}$, 14$_{2V}$ and 14$_{2W}$. The light beams of the optical fibers 14$_{2U}$, 14$_{2V}$ and 14$_{2W}$ are subjected to spectral discrimination by optical filters 14$_{3U}$, 14$_{3V}$ and 14$_{3W}$ which are in agreement with the emission spectra of the light emitting diodes in the light emitting diode circuits. The beams are then applied to light receiving diodes 14$_{4U}$, 14$_{4V}$ and 14$_{4W}$, respectively. The outputs of the light receiving diodes 14$_{4U}$, 14$_{4V}$ 14$_{4W}$ are amplified to suitable levels by amplifiers 14$_{5U}$, 14$_{5V}$ and 14$_{5W}$, so that they are applied, as decision inputs for the three phases of the rectifier, to the decision circuit 15 of FIG. 3.

Accordingly, an optical input to the photoelectric converter is applied to one of the LED's 14$_{4U}$, 14$_{4V}$ and 14$_{4W}$ according to its own unique spectrum emission, and the electrical signal is provided by the respective amplifier in correspondence to the fuse.

The output of the photo-electric converter 14 is obtained as a pulse signal corresponding to the light emission widths of the light LED's 11A$_U$, 11A$_V$ and 11A$_W$ with respect to the circumferential length of the rotor 1. This output is applied to the decision circuit 15. In the decision circuit 15, a determination is made for each phase, whether or not the pulse input is applied thereto, so that it is ascertained for each phase whether or not the fuse is blown out. When the decision circuit 15 determines that a fuse has been blown out, an output signal is produced for driving an alarm unit 16 and a protective operating signal for stopping the generator. Hence, not only is a determination made but also the particular fuse is ascertained without the need for visual inspection by an operator.

In the above-described first embodiment, the decision circuit 15 operates in response to the presence or absence of the pulse input; however, the decision circuit 15 may be modified such that input pulse width is measured. When the input pulse width thus measured is larger than a reference pulse width which is determined from the peripheral velocity of the rotor and the divergent angle of the light emitting diode, an output of the decision circuit representing the blowing of a fuse is provided. By this modification, the decision can be carried out more positively.

As described herein with respect to the embodiment, the device of the invention comprises light emitting diode circuits which emit light at different emission spectra according to the phases of the rectifier when the fuses are blown out. An optical fiber sensor couples the LED's to a decision circuit for determining the blowing of the fuses separately according to the phases from the signals which have been subjected to spectral discrimination by the photo-electric converter. Accordingly, the failure detecting device of the invention, unlike the conventional strobe type failure detecting device, can automatically and continuously monitor the diodes separately according to the phases of the rectifier. Furthermore, in accordance with the invention, the optical system is free from electromagnetic effects. The blowing of a fuse is optically detected by turning on the light emitting diode. Accordingly, the invention is much higher in reliability than the conventional mechanical failure displaying method in which the fusing flag may not reliably operate in this environment.

Furthermore, the fuses can be replaced by ordinary fusing having no fusing flags and the same effect can be obtained with a decrease in cost. Thus the fuses shown in FIG. 3 need not have the flag structure 3A as illustrated if spectra analysis is carried out.

Figure 6:
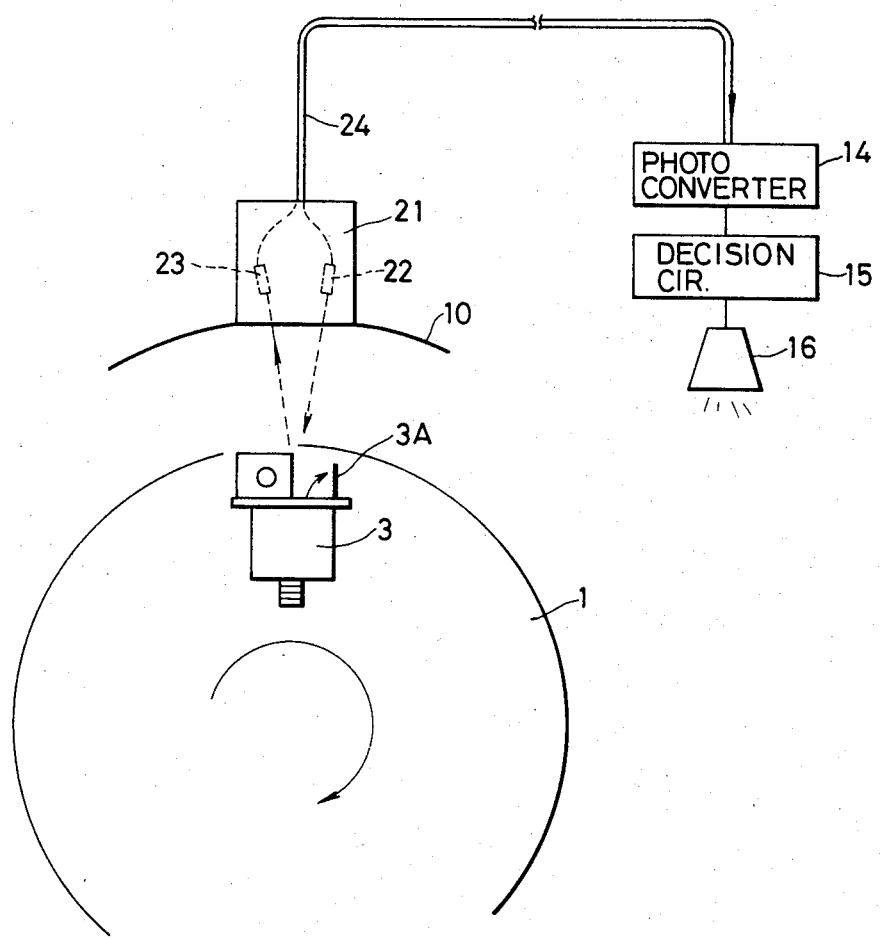
FIG. 6 is a schematic diagram showing the arrangement of a second embodiment of this invention.

FIG. 6 is an explanatory diagram showing the arrangement of a second preferred embodiment of this invention. Fuses 3 for respective phases have the above-described operation displaying units and are arranged circumferentially in such a manner that the flags 3A are disposed along the peripheral surface of a rotor 1. As shown by the arrow in FIG. 6, the flag erects when the fuse blows. An optical fiber sensor head 21 is provided on the stator 10. The optical fiber sensor head 21 comprises a light applying lens 22, a light receiving lens 23 and a pair of optical fibers 24 forming light transmitting paths to these lenses. A flag 3A of each fuse 3 on the rotor is illuminated and light reflected therefrom is received. The optical fibers 24 are connected to a photo-electric converter 14 including a light source. Light from the light source is applied to the light applying lens 22, so that the flag 3A is irradiated by a light spot through the lens 22. Light reflected from the flag 3A is received by the light receiving lens 23 and is then applied through the optical fiber 24 to the photo-electric converter 14.

Figure 7A:
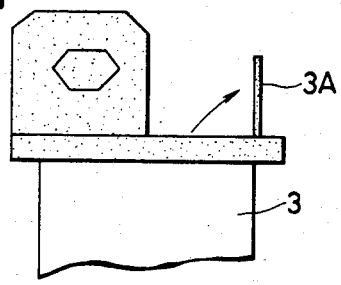
FIGS. 7A-7C are diagrams describing the relation between a fuse and a sensor light beam in FIG. 6.
Figure 7B:
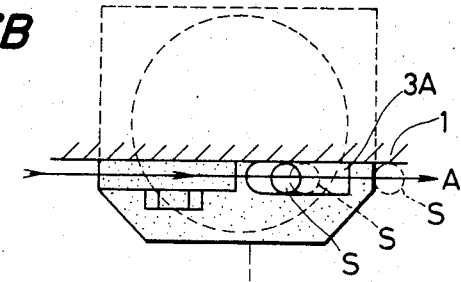
Figure 7C:
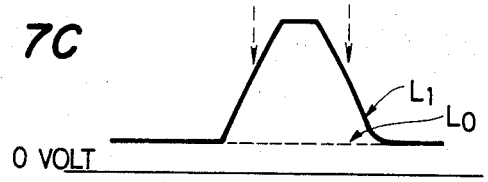

As shown in FIG. 7A and FIG. 7B, the sensor head 11 spot-lights the flag 3A of the fuse 3 as indicated by the character "S". As the rotor makes one revolution, a scanning path A is formed. When the rotor 1 turns, light reflected from the flag 3A of each fuse is received by the sensor head. The following conditions are established for sensing the light from the flags. The base color of the fuse 3, which appears when the flag 3A is raised, is the same color as that of the spot light scanning path (for instance, black), while the color of the flag 3A is different in reflection factor from the base color (for instance, white). The different colors are employed as described above. Therefore, as is clear from a detected waveform in FIG. 7C, when the flag 3A is not raised (i.e., no blown fuse), the level of intensity of the reflected light or the level of electrical data obtained from the reflected light is changed forming a pulse at the position of the flag 3A (as indicated by the solid line $L_1$). When the flag 3A is raised to indicate a blown fuse, the level remains substantially equal to that of the scanning line at the position of the flag 3A (as indicated by the broken line $L_0$). It is changed to a pulse at the positions of the remaining untriggered flags 3A. Accordingly, under normal conditions where none of the fuses are blown out, the reflected-light detection level of the sensor head 11 is a pulse train having a pulse $L_1$ whenever each of the flags 3A passes through the irradiated region (field of vision). When a fuse of at least one phase is blown out, the pulse repetition rate becomes discontinuous; that is, one pulse level repetitive change is omitted.

In the level change detection with the sensor head 11, light should be sufficiently focused and condensed by the lenses 22 and 23. For this purpose, the distance between the head 21 and the flag 3A is maintained sufficiently long. By example, with the distance between the head 11 and the flag 3A being 50 to 80 mm, the level can be detected with a high resolution of 4 mm $\phi$ or more.

Referring back to FIG. 6, the photo-electric converter 14 operates to convert the optical input from the sensor head 21 into an electrical data, which is for instance two-valued (as in the form of pulses) with a certain threshold level. The pulse output of the photo-electric converter 14 is applied to a decision circuit 15, which determines the operation and non-operation of a fuse according to whether the number of input pulses per revolution of the rotor 1 corresponds or not to the number of phases of the rectifier. When the decision circuit 15 determines that a fuse has been blown, it provides a signal for driving an alarm unit 16 and a protective operating signal to stop the generator.

Figure 8:
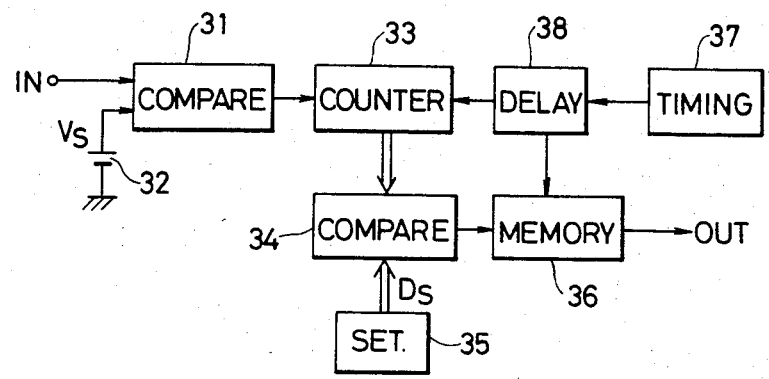
FIG. 8 is a block diagram showing a decision circuit in FIG. 6.
Figure 9:
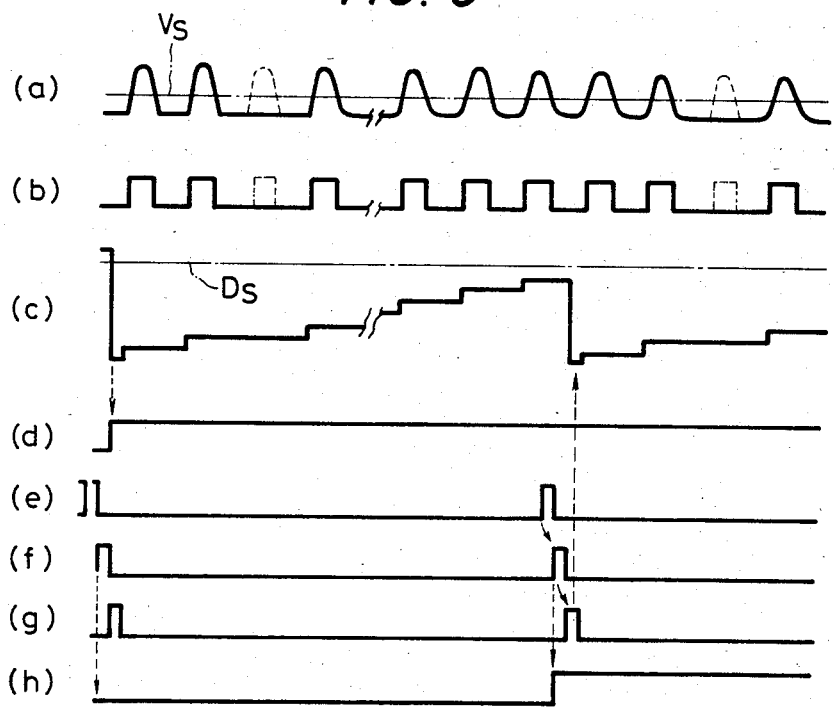
FIG. 9 is a waveform diagram showing signals at various circuit points in FIG. 8.

The decision circuit 15 of this second preferred embodiment is shown in FIG. 8. FIG. 9 shows the waveforms of signals at various circuit points in the decision circuit 15. An input signal, waveform (a) of FIG. 9 from the photoelectric converter 14 is converted into a pulse signal (two-valued) by comparison with a reference voltage $V_S$ from source 32 in a comparator 31. Thus, the operations of the fuses are taken as a pulse train signal because the fuses are set at different positions on the rotor. The output (waveform (b) of FIG. 9) of the comparator 31 is counted by a pulse measuring unit, such as a counter, 33 which is reset for each revolution of the rotor. The count value (waveform (c) of FIG. 9) of the pulse measuring unit 33 is applied to a digital comparator 34, where it is compared with a reference value $D_S$ from a setting unit 35. When the count value of the measuring unit 33 is smaller than the reference value $D_S$, the comparator 34 provides a logical level "1" output; and when the count value is larger, the comparator 34 provides a logical level "0" output (waveform (d) of FIG. 9). The reference value $D_S$ is the total number of fuses provided on the rotor. Accordingly, when none of the fuses are blown out, the output of the comparator 34 is changed from the "1" level to the "0" level upon one revolution of the rotor. However, when the fuses of at least one phase are operated, the logical "1" level is maintained. The output of the comparator 34 is applied to a memory circuit, such as a flip-flop circuit, 36.

Rotary motion of the rotor 1 is detected by a time measuring unit 37 in synchronization with each revolution of the rotor 1. The detection pulse (waveform (e) of FIG. 9) of the time measuring unit is applied to a delay circuit 38, which in turn outputs two pulses of different phase, waveforms (f) and (g) of FIG. 9. Of the two pulses, the one occurring earlier in time is employed as a strobe signal (collating pulse) for the memory circuit 36. With the timing of the signal, the result of comparison by the comparator 34 is supplied to the memory circuit 36. The pulse occurring later in time is applied, as a reset signal, to the pulse measuring unit 33.

The pulse measuring unit 33 counts the input pulses whenever reset by the output of the delay circuit 38. When none of the fuses are blown out, after one revolution of the rotor, the count value is larger than the reference value $D_S$. The output of the comparator 34 is set to the "0" level at that timing. Under this condition, the output level (waveform (h) of FIG. 6) of the memory circuit 36, to which the collating pulse is applied, is maintained unchanged. However, if at least one fuse is blown out, with the timing of the collating pulse, the output of the comparator 34 is maintained at the logical level "1", and can be detected as the change of the state of the memory circuit 36.

As is apparent from the above description of this second preferred embodiment, automatic detection is carried out by means of the optical fiber sensor and the decision circuit. The failure detecting device according to the invention, unlike the conventional strobe type failure detecting device, can continuously and automatically monitor the diodes, without manual operation. No modifications of the rotor assembly are needed. Furthermore, the detecting device of the invention is an optical system and the sensing function is free from electromagnetic effects. Allowing the detecting device to function for monitoring the conditions of fuses makes it possible to monitor the operation of the device itself.

Thus, the detecting operation of the device offers high accuracy and reliability.

If, in this embodiment, the fuse flags are colored to have different reflectivities according to the phase of the rectifier, level determination for each pulse can be carried out in which the flags are irradiated by a visible light source and the photoelectric conversion of light reflected from the flags thus irradiated is effected with spectral discrimination. Then, defective diodes can be individually detected as in the case of the first preferred embodiment.

In a first modification of the second preferred embodiment, the pulse output of the photo-electric converter 14 is applied to a decision circuit 15, but, in the decision circuit 15, the pulse output thus applied is compared with a reference pulse (digital data) having a pulse width which is determined according to the peripheral velocity of the rotor to determine whether or not a fuse has been blown out. When the decision circuit 15 determines that a fuse has been blown out, it provides a signal for driving an alarm unit 16, and a protective operating signal to stop the generator.

Figure 10:
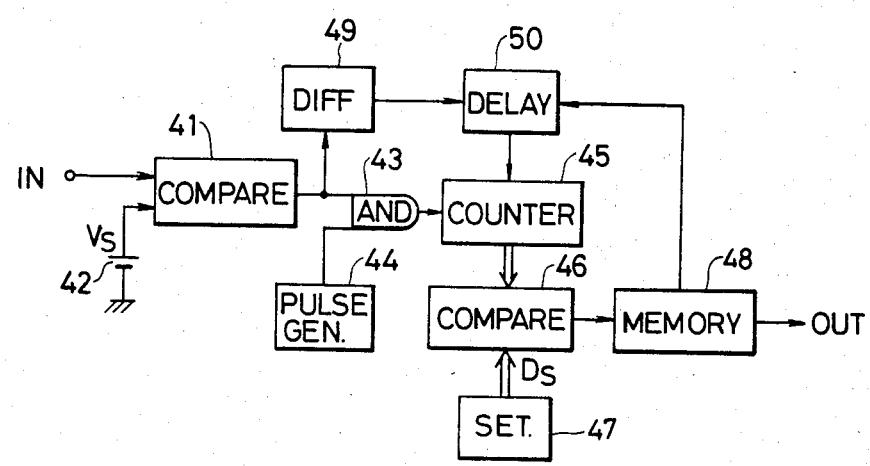
FIG. 10 is a block diagram showing a modified decision circuit of FIG. 8.
Figure 11:
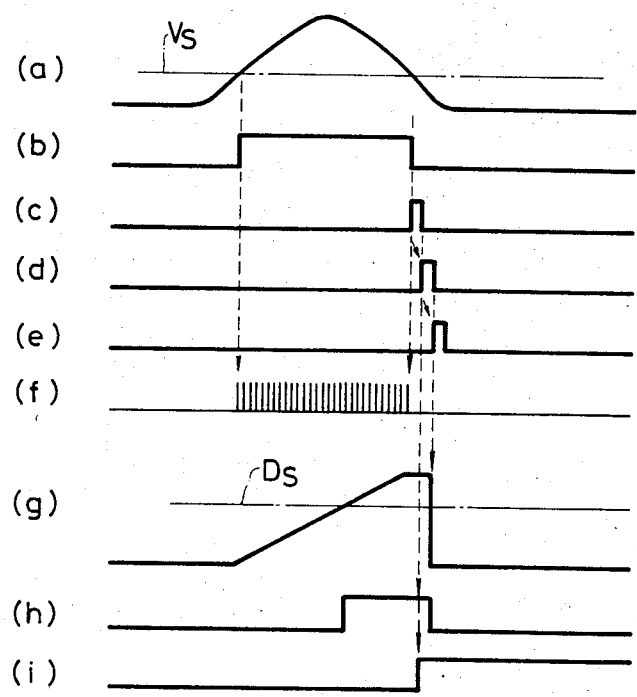
FIG. 11 is a waveform diagram showing signals at various circuit points in FIG. 10.

FIG. 10 shows in detail the decision circuit 15 of this modification, and FIG. 11 shows the waveforms of signals at various circuit points in the decision circuit 15. An input signal waveform (a) in FIG. 11 from the photo-electric converter 14 is applied to a comparator 41 where it is converted into a pulse waveform (two-valued) and compared with a reference voltage $V_S$ provided by a reference voltage source 42. Thus, the operation of the fuses is as in FIG. 8 defined as a pulse train signal because the fuses are set at different positions on the rotor. The output, waveform (b) of FIG. 11 of the comparator 41 is applied to one input terminal of an AND gate 43 the other input terminal of which a clock pulse from a pulse generator 44 is applied. As a result, the AND gate 43 provides a pulse-number output (waveform (f) of FIG. 11) proportional to the output pulse width of the comparator 41. The output of the AND gate 43 is applied to a counter 45, which provides a count value. The count value of the counter 45 linearly increases in proportion to the number of input pulses as shown in waveform (g) of FIG. 11. The count value of the counter 45 is applied to a digital comparator 46 to which a comparison reference value $D_S$ is applied by a setting unit 47 to be compared with the count value. When the count value of the counter 45 is larger than the reference value $D_S$, the comparator 46 provides a logical level "1" output, which is applied to a memory circuit (such as a flip-flop circuit) 48.

On the other hand, the output of the comparator 41 is further applied to a differentiation circuit 49, where the trailing edge of the output is detected. The output pulse of the differentiation circuit 49 is applied to a delay circuit 50, which in turn provides two pulses different in phase, waveforms (d) and (e) of FIG. 11. Of the two pulses, one occurring earlier in time is employed as a strobe (collating pulse) signal for the memory circuit 48. With the timing of the strobe signal, the result of comparison by the comparator 46 is applied to the memory circuit 48, and a logical level "1" signal is stored in the latter 48, waveform (i) of FIG. 11. On the other hand, the pulse occurring later in time is applied, as a reset signal, to the counter 45.

Accordingly, if the reference value is set to a smaller value than that determined from the peripheral velocity of the rotor 1, the length of the flag 3A and the frequency of the output clock pulse of the pulse generator 44, with the timing of the collating pulse signal from the delay circuit 60, it can be detected from the output of the memory circuit whether or not a flag 3A has been raised, i.e., whether or not a fuse has been blown out.

As is clear from the above description of this modification of the second embodiment of the invention, automatic detection is carried out by means of the optical fiber sensor and the decision circuit. The failure detecting device of the invention, unlike the conventional strobe type failure detecting device, can continuously and automatically monitor the fuses, without manual operation. Furthermore, the determination is carried out by the detection of a pulse width larger than the predetermined value, which results in accurate and positive detections of fuse blow out.

Figure 12:
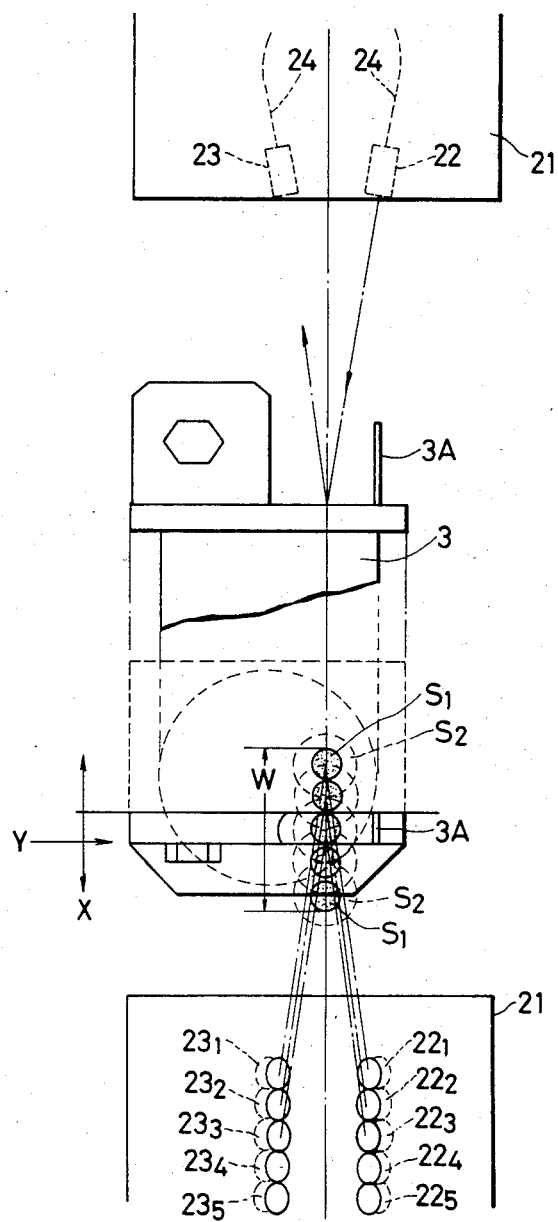
FIG. 12 is an explanatory diagram describing the relation between a fuse and a sensor light beam in FIG. 6 in accordance with a second modification of that embodiment.

A second modification of the embodiment of FIG. 6 is shown in FIG. 12. As shown in FIG. 12, five light applying optical path systems and five light receiving optical path systems are provided. The five light applying optical path system and the five light receiving optical path systems have light applying lenses $22_1$ through $22_5$ and light receiving lenses $23_1$ through $23_5$, so that light applying spots $S_1$ and light receiving spots $S_2$ of different diameter are formed at the same positions. A light applying region and a light receiving region which are extended in the axial direction of the rotor is thereby defined.

The sensor head 21 is constructed as described above with respect to FIG. 6. Accordingly, as the rotor 1 turns in the direction of the arrow Y, a flag (3A) scanning path having a width W in the axial direction X of the rotor is formed. In this connection, the following conditions are established for the sensing operation of the sensor head 21. In order to detect the operation (blowing) of each fuse from the intensity of reflected light, the irradiation (field of vision) region is painted black, to be readily distinguished from the base color (silver) of the flag which is raised when the fuse 3 is blown out. That is, different colors having different reflectivities are employed. Accordingly, the level of intensity of reflected light in the sensing system which irradiates the flag 3A is changed to define a series of pulses. Since the sensing range of the sensor head 21 has the width W in the axial direction X of the rotor 1, at least one detecting system can optically detect a blown fuse even if the rotor 1 is shifted in the axial direction by thermal contraction due to change in ambient temperature of mechanical displacement but remains within the width W.

Employment of the light receiving lenses and light application lenses makes it possible to provide a sufficiently long detection distance. For instance, with the distance between the sensor head 21 and the fuse flag 3A being 50 to 80 mm, the level can be detected with a high resolution of 4 mm $\phi$ or more.

Since the lenses are employed for applying and receiving light, the sizes of the light applying spot and the light receiving spot can be changed as desired. In order to increase the sensitivity, that is, reflected light receiving efficiency, the light applying spot diameter is smaller than the light receiving spot diameter. In order to decrease the detection width, the light applying spot diameter is equal to or larger than the light receiving spot diameter. Thus, the sensing condition can be changed by means of the lenses. In this embodiment, in order to increase the detection distance and to increase the sensitivity, the light applying spot diameter is smaller than the light receiving spot diameter as shown in FIG. 12.

Figure 13A:
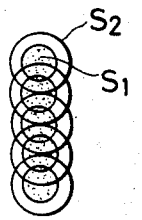
FIGS. 13A and 13B is an explanatory diagram showing other examples of an arrangement of light spots on the detection surface.
Figure 13B:
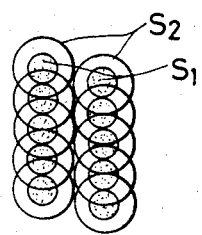

The light applying spots and the light receiving spots are such that the light applying spots $S_1$ are partially overlapped by one another as shown in FIG. 13(a). They may also be arranged in two lines as shown in FIG. 13(b).

Referring back to FIG. 6, the photo-electric converter 14 having the light source operates to convert the optical input from the sensor head 21 into an electrical data, which is, for instance, two-valued (as in the form of pulses) with a certain threshold level. The pulse output of the photoelectric converter 14 is applied to a decision circuit 15. In the decision circuit 15, the pulse output thus applied is compared with a reference pulse (digital data) having a pulse width which is determined according to the peripheral velocity of the rotor, to determine whether or not a fuse has been blown out. When the decision circuit 15 determines that a fuse has been blown out, it provides a signal for driving an alarm unit 16 and a protective operating signal to stop the generator.

Figure 14:
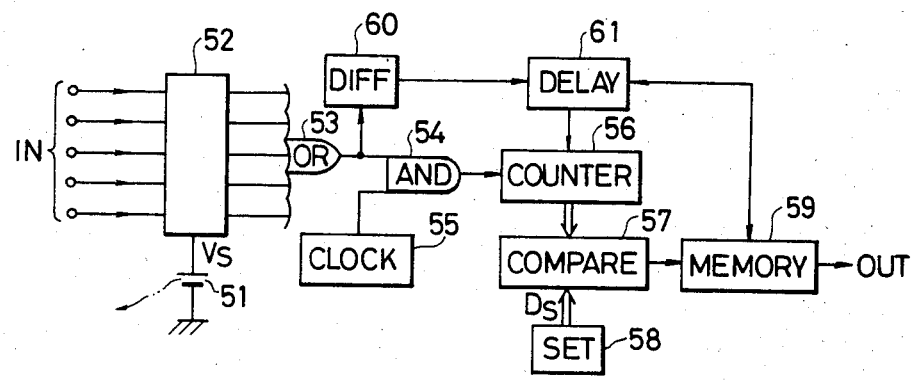
FIG. 14 is a block diagram showing a modified decision circuit in FIG. 6.
Figure 15:
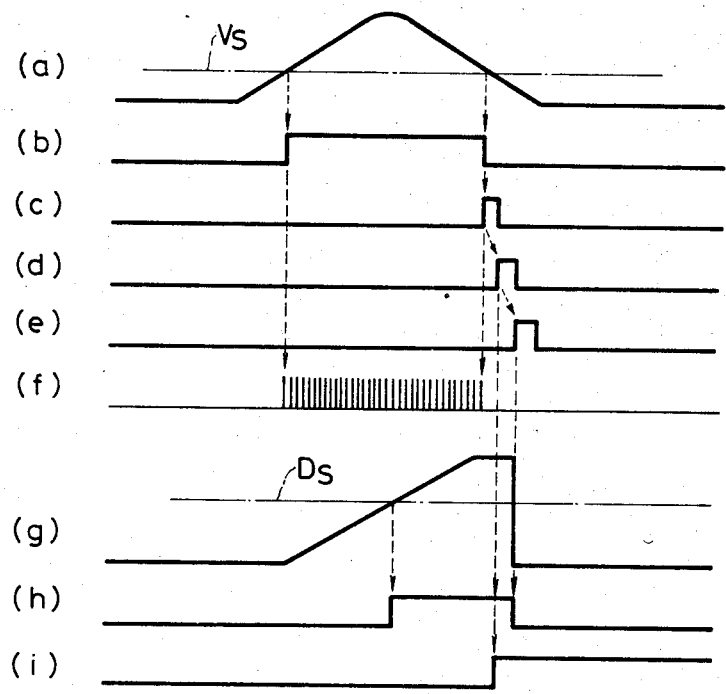
FIG. 15 is a waveform diagram showing signals at various circuit points in FIG. 14.

FIG. 14 illustrates a decision circuit 15 in accordance with this second modification, and FIG. 15 shows the waveforms of signals at various circuit points in FIG. 14. Input signals from the optical systems are applied through the photoelectric converter 14 to a comparator 52 with a reference voltage source 51, where they are compared with a reference voltage $V_S$. When the blowing of a fuse is detected, at least one of the input signals IN exhibits a voltage variation as indicated in FIG. 15(a). Accordingly, in response to the input signal of this system, the comparator 52 outputs a pulse (two-valued) signal as indicated in FIG. 15(b) for each input signal. Thus, the operations of the fuses are converted into pulse train signals because the fuses are disposed at different positions on the rotor. The outputs of the comparator 52 are applied to an OR gate 53. Therefore, when the fuse of any one of the systems is blown out, the pulse signal as shown in FIG. 15(b) is provided at the output terminal of the OR gate.

The output of the OR gate 53 is applied to an AND gate 54 to which a clock pulse is supplied by a pulse generator 55. As a result, the AND gate 55 provides a pulse-number output (waveform (f) of FIG. 15) proportional to the input pulse width. The output of the AND gate 54 is counted by a counter 56. The count value of the counter 56 linearly increases in proportion to the number of input pulses as shown in FIG. 15(g). The count value of the counter 56 is applied to a digital comparator 57, to which a reference value $D_S$ is applied by a setting unit 58. When the count value of the counter 56 is larger than the reference value $D_S$, the comparator 57 provides a logical level "1" output, which is applied to a memory circuit (such as a flip-flop circuit) 59.

On the other hand, the output of the OR gate 53 is further applied to a differentiation circuit 60, where the trailing edge of the output is detected. The output pulse of the differentiation circuit 60 is supplied to a delay circuit 61, which in turn provides two pulses of different phase (FIG. 15(d) and FIG. 15(e)). Of the two pulses, one occurring earlier in time is employed as a strobe (collating pulse) signal. The result of comparison by the comparator 57 is supplied to the memory circuit 59, and a logical level "1" signal is stored in the latter 58 (FIG. 15(i)). On the other hand, the pulse occurring later in time is applied, as a reset pulse, to the counter 56.

Accordingly, if the reference value is set to a value smaller than that which is determined from the peripheral velocity of the rotor 1, the length of the flag 3 and the frequency of the output clock pulse of the pulse generator 55, with the timing of the collating pulse signal from the delay circuit 51, a detection can be made from the output of the memory circuit 59 whether or not a flag 3A has been raised, i.e., whether or not a fuse has been blown out.

As is apparent from the above description of this embodiment of the invention, the automatic detection is performed by means of the optical fiber sensor and the decision circuit. The failure detecting device of the invention, unlike the conventional strobe type failure detecting device, can continuously and automatically monitor the fuse, without manual operations. Furthermore, the detecting device of the invention is of an optical system that the sensing is free from electromagnetic effects, and the determination is carried out in one embodiment under the condition that the detection pulse width is larger than the predetermined value, or by sensing the absence of a pulse, resulting in accurate and positive detections. Moreover, in accordance with one embodiment of the invention, the line detection system where light is applied to and received from the fuse flag widthwise in the axial direction of the rotor is employed, with the result that, even if the fuses are displaced, for instance, by the thermal contraction of the rotor, detection is positively achieved. In addition, detection is improved in sensitivity and reliability by changing the sizes of the light applying spot and the light receiving spot, overlapping these spots or increasing the number of lines of light spots.

In these embodiments, the fuse flags may be colored separately according to the phase arms. The flags thus colored are irradiated by a visible light source and the photo-electric conversion of light reflected from the flags thus irradiated is effected with spectral discrimination. The decision circuits for the phases are modified into one decision circuit which is operated in a time division mode to determine which diode is defective.

It is apparent that other modifications of this invention may be practiced without departing from the essential scope of this invention.

We claim:

1. A diode failure detecting system in a rotary rectifier device having a rotor and a stator comprising:
a plurality of fuses on said rotor connected in series to a plurality of rectifying diodes;
fusing flag means arranged along the peripheral surface of said rotor and associated with each fuse to indicate whether or not said fuse has blown out;
optical means on said stator to continuously monitor said fusing flag means to indicate whether said fuse has blown out and produce an optical output, said optical means comprising an optical fiber sensor having a light applying section for irradiating said fusing flag of each fuse and, a light receiving section for receiving light reflected from said fusing flag;
photo-electric converter means converting a reflected light beam from said receiving section into an electrical signal to generate a regular pulse train signal when said fuses are not blown out and to generate a regular pulse train signal lacking a periodic pulse or pulses when said fuse or fuses are blown out; and decision circuit means counting the number of pulses for each revolution of said rotor from said pulse train signal from said photo-electric converter for determining the flow of over-current in a diode when said count is smaller than a preset value.

2. A diode failure system of claim 1, wherein said fuse and said fusing flag means are color coded to have differences in reflection characteristics.

3. A diode failure system of claim 2, wherein each of said fusing flag means is color coded to have differences in spectral reflection characteristics.

4. A diode failure system of claim 1, wherein said decision circuit comprises a counter for counting each pulse in said pulse train and producing an output for each revolution of said rectifier, a comparator receiving said count and comparing it with a predetermined value corresponding to the number of fuses and producing a logical output indicative of whether any of said fuses are blown, and means to reset said counter at the completion of a revolution of said rectifier to deliver said count to said comparator.

5. The diode failure system of claim 8, further comprising memory means receiving the output of said comparator and said reset means providing a collating signal to said memory means.

6. A diode failure detecting system in a rotary rectifier device having a rotor and a stator comprising:

a plurality of fuses on said rotor connected in series to a plurality of rectifying diodes;

fusing flag means arranged along the peripheral surface of said rotor and associated with each fuse to indicate whether or not said fuse has blown out;

optical means on said stator to continuously monitor said fusing flag means to indicate whether said fuse has blown out and produce an optical output, said optical means comprising an optical fiber sensor having a light applying section for irradiating said fusing flag of each fuse and, a light receiving section for receiving light reflected from said fusing flag;

photo-electric converter means converting a reflected light beam from said receiving section into an electrical signal to generate a pulse signal representing the status of each fuse; and decision circuit means determining the flow of over-current in a diode when a count value corresponding to the pulse width of a pulse signal output of said photo-electric converter is larger than a predetermined set value.

7. The diode failure system of claim 6, wherein said decision circuit comprises an AND gate having said pulse signal as a first input and a clock source has a second input to produce a pulse number output proportional to the output pulse width of said pulse signal, a counter receiving said pulse number output and generating a count value that linearly increases in proportion to said pulse number output;

a comparator receiving said count and comparing it with a predetermined value to produce a logical output indicative of whether any of said fuses are blown, and means to reset said counter at the end of said pulse signal.

8. The diode failure detecting system of claim 7, further comprising memory means receiving the output of said comparator.

9. The diode failure detecting system of claim 7, wherein said reset means comprises means to sense the trailing edge of said pulse signal.

10. The diode failure detecting system of claim 6, wherein said spots of a first diameter overlap each other and said spots of a second diameter overlap each other.

11. The diode failure detecting system of claim 6, wherein said light applying section comprises a plurality of light application lenses illuminating said indicating means with light spots of a first diameter and, said light receiving section comprises a plurality of light receiving lenses defining sensing locations on said indicating means of a second diameter larger than said spots of a first diameter.

12. The diode failure detecting system of claim 11, wherein said light receiving lenses receive a plurality of reflected light beams, said photoelectric converter converting said reflected light beams into a plurality of pulse signals cumulatively representing the status of each fuse; said decision circuit having an OR gate receiving said pulse signals and producing an output when a pulse signal exceeds a predetermined value.

13. The diode failure system of claim 12, wherein said decision circuit further comprises an AND gate having the output of said OR gate as a first input and a clock source as a second input to produce a pulse number output proportional to the output pulse width of said OR gate, a counter receiving said pulse number output and generating a count value that linearly increases in proportion to said pulse number output;

a comparator receiving said count and comparing it with a predetermined value to produce a logical output indicative of whether any fuses are blown, and means to reset said counter at the end of said pulse output from said OR gate.

14. The diode failure detecting system of claim 13, further comprising memory means receiving the output of said comparator.

15. The diode failure detecting system of claim 13, wherein said reset means comprises means to sense the trailing edge of said pulse output of said OR gate.

* * * * *